United States Patent [19]

Vogelsong et al.

[11] Patent Number: 4,625,293

[45] Date of Patent: Nov. 25, 1986

[54] PARALLEL PROGRAMMABLE CHARGE DOMAIN DEVICE

[75] Inventors: Thomas L. Vogelsong, Clifton Park; Jerome J. Tiemann, Schenectady, both of N.Y.

[73] Assignee: The United States of America as represented by the Secretary of the Air Force, Washington, D.C.

[21] Appl. No.: 679,327

[22] Filed: Dec. 7, 1984

[51] Int. Cl.⁴ ........................ H01L 29/78; G06G 7/16

[52] U.S. Cl. ........................ 364/606; 357/24; 340/347 DA; 364/841

[58] Field of Search ............... 364/606, 602, 841, 844, 364/862; 357/24; 377/57, 58, 59, 60, 61, 62, 63; 340/347 DA

[56] References Cited

U.S. PATENT DOCUMENTS

| | | | |
|---|---|---|---|
| 4,107,550 | 8/1978 | Jacquart et al. | 307/241 |
| 4,117,349 | 9/1978 | Hornak et al. | 307/221 D |
| 4,161,783 | 7/1979 | Wrench, Jr. et al. | 364/606 |
| 4,177,391 | 12/1979 | Sunami et al. | 307/221 D |
| 4,259,597 | 3/1981 | Tiemann | 307/221 D |
| 4,259,598 | 3/1981 | Tiemann et al. | 307/221 D |
| 4,298,953 | 11/1981 | Monroe | 364/825 |
| 4,316,258 | 2/1982 | Berger | 364/602 |

*Primary Examiner*—E. A. Goldberg
*Assistant Examiner*—M. Reinhart
*Attorney, Agent, or Firm*—Richard J. Donahue; Donald J. Singer

[57] ABSTRACT

Programmable signal processing apparatus for multiplying a sampled analog signal by a multiple bit digital word coefficient. All signal processing operations are accomplished by the splitting, routing and combining of charge packets formed in a charge domain device.

2 Claims, 4 Drawing Figures

PARALLEL PROGRAMMABLE CHARGE DOMAIN DEVICE

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to signal processing apparatus and more particularly to a programmable charge domain device which allows a sampled analog signal to be multiplied by a multiple-bit digital word coefficient.

A new class of integrated circuits, called charge domain devices (CDD) has been developed with the goal of performing signal processing functions with accuracy and speed performance exceeding alternative technologies. The starting point for this development is conventional charge transfer device (CTD) technology. Devices of this type, such as charge coupled device (CCD) transversal filters, have been demonstrated in many cases, particularly at high frequencies, to be more efficient in performing certain sampled data processing functions than such alternative techniques as digital filters or switched capacitor devices. However, as the speed and accuracy performance requirements increase, conventional CTD's also encounter a number of limitations. In order to understand the origin of some of these limitations, the operation of conventional CTDs is described briefly herein.

Conventional CTD's derive their output signal by sensing charge packets with overlying MOS electrodes. Multiplication of these charges by tap weights is implemented by splitting the overlying electrodes in proportion to the desired impulse response coefficient, and summation is implemented by connecting the overlying electrodes. This implementation is particularly efficient, since all of the mathematical operations required for a particular filter response are accomplished automatically by simple physical laws rather than by manipulating binary bits in complex logic circuits, but it creates at least two problems. First, as the specifications on the system increase, and the number of filter coefficients needed to accomplish the desired transfer function increases, the total capacitance of the output electrode increases, making high speed operation more difficult; and second, non-linearities in the relationship between the charge in the packets and the voltage induced on the overlying electrodes usually compromises the accuracy of the transfer function if buried channel technology is used. These constraints have in the past limited the frequency handling capabilities of conventional CTD filters to a few megahertz.

Charge domain integrated circuits have been developed to overcome these limitations so, as to increase the frequency range that can be handled by monolithic signal processing chips. In charge domain devices, all signal processing is performed by manipulating the charge packets themselves, rather than using the image charge on overlying electrodes. The charge packets representing the input signal may be split, routed, delayed and combined to form new charge packets that represent the output signal. But since the splitting and routing depend only on the plan view geometry of the devices that accomplish it, and not on the details of the capacitance-voltage characteristic, buried channel technology can be used without degrading the accuracy of the transfer function. Furthermore, since portions of some charge packets can be routed backwards in the signal flow sense and re-introduced into the forward path, CDD's, yield the new possibility of filters with infinite impulse response; i.e., filters that implement poles as well as zeroes in their transfer function. Finally, since the output of these devices is a stream of charge packets, low capacitance diode sensing of the charge is used to generate the output signal. Thus, the output capacitance does not increase as the filter architecture becomes more complex, and device speed is limited only by the speed of charge transfer which, for buried channel technology, may be as fast as hundreds of megahertz.

Conventional CCD transversal filters use fixed tap weights which are determined photolithographically. This means that an entirely new device must be fabricated for each new application.

Many new approaches have been proposed for making CTD filters programmable, but all of these have serious drawbacks. One approach uses MNOS transistors as the multipliers for each coefficient, but these are difficult to process reliably and the accuracy and lifetimes are limited. In another approach, MOS switches are used to connect the overlying electrodes to the plus or minus terminals of a differential amplifier providing coefficients of plus or minus one. Arbitrary coefficients can be obtained by paralleling filters with binary weightings and summing the outputs, but this requires N channels for N bit coefficients which uses up area and power. Also, threshold variations between channels causes accuracy degradation.

OBJECTS OF THE INVENTION

It is therefore an object of the present invention to provide a programmable charge domain device.

It is a further object of the present invention to provide a parallel programmable charge domain device which accomplishes the multiplication of an analog signal by a digital coefficient representing a number between 0 and 1 or between $-1$ and 1.

BRIEF DESCRIPTION OF THE DRAWINGS

Other objects, features and advantages of the invention will become apparent from the following description of the preferred embodiment of the invention taken together with the drawings in which.

DETAILED DESCRIPTION OF THE DRAWINGS

There are several degrees of programmability which can be incorporated in a CDF (charge domain filter) design, and in general the more flexible approaches are more costly in terms of chip size, speed, or complexity. The lowest degree of programmability is inherent in any clocked CDF design. The absolute frequency response can be altered just by changing the clocking frequency. A bandpass filter can shift its center frequency in proportion to the clock frequency. The bandwidth, however, also scales with the clock frequency. For some communications systems, where tuning range is small, this degree of flexibility may be adequate.

Figure 1:
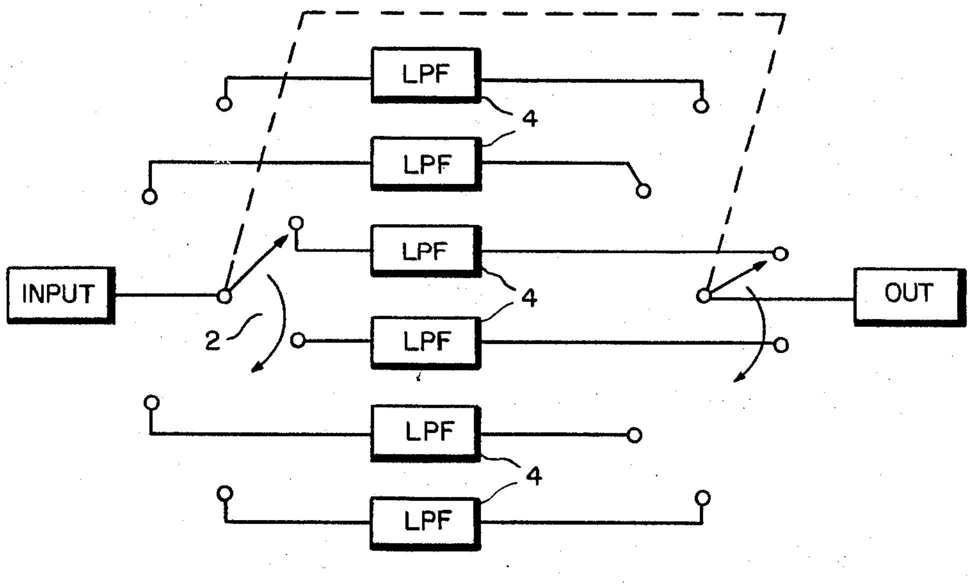
FIG. 1 is a functional block diagram representation of an N-path filter.

The next step up in flexibility is to have a fixed band shape but have independently variable center frequency and bandwidth. An approach which implements this function is the N-path filter shown schematically in FIG. 1. The commutator 2 at the input demodulates the desired incoming signal frequency down to baseband samples and the commutation speed determines the center frequency. The baseband samples pass through a bank of parallel low pass charge domain filters 4. The clocking frequency of these filters is used to program the bandwidth. The output of these filters can be synchronously modulated up to the original frequency if desired. Alternatively the baseband signals may be used as outputs. When the number of parallel filters is four, the baseband signals can be combined to give the in phase (I) and quadrature (Q) outputs directly. This technique has been analyzed to some extent, but most of the efforts in this area have been directed at the next tier of programmability.

The next level up in the programmability chain is the capability of altering the coefficients electrically, but not changing the architecture. This technique allows a wide range of flexibility in filter design while maintaining a reasonable chip size.

The first task is to define programmable charge splitter structures. Three basic devices are disclosed herein and have been evaluated experimentally. The first is an in-place sequential charge splitter shown schematically in FIG. 2 of the drawings. This device forms the basis of a separate patent application by the same co-inventors entitled "Signal Processing Apparatus," filed Nov. 2, 1983, bearing Ser. No. 548,067, and assigned to General Electric Company. It uses a gated equilibration splitting scheme.

Figure 2:
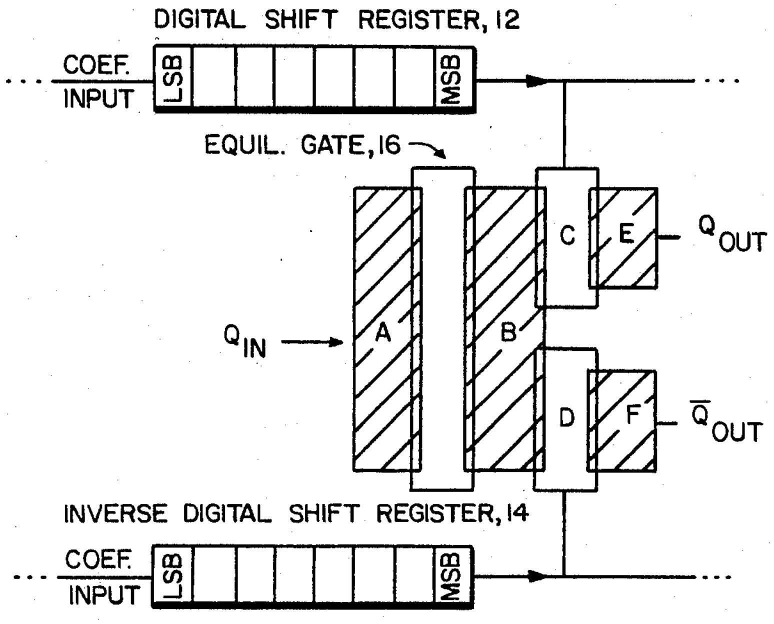
FIG. 2 is a schematic diagram of an in-place sequentially programmable charge splitter.

As shown in FIG. 2, a digital shift register 12 and an inverse digital shift register 14 supply the digital coefficients, most significant bit (MSB) first. The charge packet $Q_{in}$ is introduced into the potential well A formed under the associated A gate. Meanwhile the B well is empty. At this time the equilibration gate 16 is opened and closed leaving half of the charge packet under A and half under B. It will be noted that a splitting ratio of 0.5 simplifies the balancing of the charge splitting mechanism. At this point either the C or D gate is turned on depending on the MSB, and the $\frac{1}{2}$ charge packet is transferred to the E or F accumulator well. Now the A well contains $\frac{1}{2}$ the input packet and the B well is empty. The equilibration gate 16 again turns on and off leaving $\frac{1}{4}$ of the original packet under A and $\frac{1}{4}$ under B. The second bit of the digital coefficent channels the $\frac{1}{4}$ under B to the E or F accumulator. The splitting and channeling continues for $\frac{1}{8}$, 1/16, etc., for N bits where N is as many bits as is desired. After all the signal (possibly including the leftover $\frac{1}{2}^N$ portion) has been channeled, the outputs $Q_{out}$ and $Q_{out}$ can be read out with overlying electrodes (non-destructive readout) and the entire charge packet returned to the A/B reservoir, or with a diode (destructive readout) and a new input sample $Q_{in}$ can be introduced.

This device has the advantages of being compact in size and universal in structure with respect to the number of bits that may be used. Its disadvantage is that the cycle time for a full multiplication is equal to the clock period of the splitter multiplied by the number of bits. This disadvantage is, however, ameliorated by the high inherent speed of the splitting mechanism.

An experimental test unit was constructed and used to evaluate this device. The digital shift registers were off-chip although a production circuit would include on-chip shift registers. The device was operated as a multiplying digital-to-analog converter (MDAC) where the analog input was a DC value and the coefficients were decremented from 127 to 0 (for a 7 bit conversion). The output demonstrated excellent linearity over the entire range, with the greatest error at the 64–63 coefficient transition. Seven to eight bits of linear operation were demonstrated with no degradation at splitting speeds up to 15 MHz. The number of bits was limited by the accurate transfer of charge from the B well to the E or F wells in a short period of time. Structural improvements would yield 9–10 bits of capability.

Figure 3:
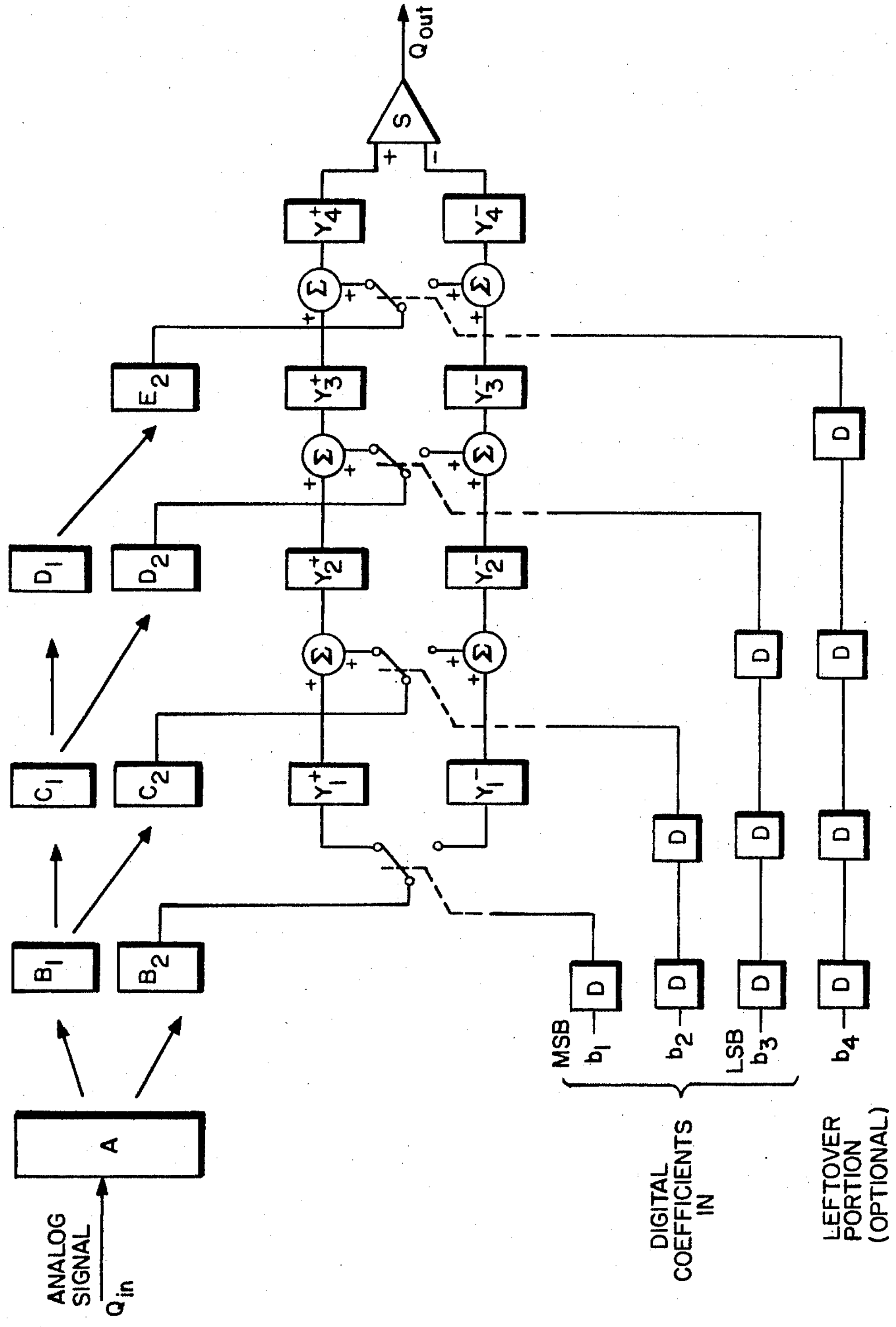
FIG. 3 is a schematic diagram of a pipelined programmable charge splitter.

A second programmable charge splitter device, which is claimed in a copending patent application by the present inventors entitled Pipelined Programmable Charge Domain Device, bearing Ser. No. 679,332 and filed concurrently herewith, overcomes the speed limitations of the sequential splitter at the expense of an increase in chip size. This is the pipelined charge splitter device shown schematically in FIG. 3 of the drawings. In this case splitting takes place unidirectionally in several stages with each stage providing one binary bit of increased resolution. Accumulators are clocked in synchronism with the splitters such that after several clock cycles the product result appears at the output. Due to the pipelining concept, the next result appears one cycle later. Therefore the throughput rate of this technique is equal to the clock rate.

The size of the charge packet entering well A is proportional to a sample of the analog input signal $Q_{in}$. While being transferred from well A to well B the charge packet is split into two halves by a technique such as dynamic charge splitting.

Such a charge splitting is identical to a basic charge transfer operation except that the receiving well is comprised of two or more wells whose total capacitance is substantially equal to that of the source well, but whose relative sizes correspond to predetermined ratios. Once the charge has been split into portions, each individual portion can be manipulated independently. This unilateral splitting action can be conveniently obtained by starting the leading edges of the barrier regions that separate the receiving wells in the transfer gate region of the structure.

The $\frac{1}{2}$ packet under $B_2$ is now channeled to either the $Y_1^+$ or the $Y_1^-$ accumulator well depending on the most significant bit (MSB) of the digital coefficient. This MSB has gone through delay element D to maintain synchronism between the analog signal and the digital coefficient. Meanwhile the $\frac{1}{2}$ packet under $B_1$ is split into two portions as it transfers to $C_1$ and $C_2$. The $\frac{1}{4}$ packet under $C_2$ is channeled to either accumulator well $Y_2^+$ or $Y_2^-$ under control of the second bit. At this point it is added to the partial sum coming out of the previous stage. The $\frac{1}{4}$ packet continues on to succeeding stages where it is split and channeled as $\frac{1}{8}$, 1/16, . . . $\frac{1}{2}^N$ where N is the number of bits. Finally the leftover portion $\frac{1}{8}$, as shown in $D_1$ and $E_2$ may be added into the appropriate accumulator. The resulting charge packet in $Y_{N+1}^+$ is:

$$Q_{out}^{+} = \left[ \sum_{i=1}^{N} b_i(\tfrac{1}{2}^i) + b_{N+1}(\tfrac{1}{2}^N) \right] Q_{in}$$

and the charge packet in $Y_{N+1}^-$ is:

$$Q_{out}^{-} = \left[ 1 - \frac{Q_{out}^{+}}{Q_{in}} \right] Q_{in}$$

When the difference is taken in charge combiner S, the result is:

$$Q_{out} = Q_{out}^{+} - Q_{out}^{-} = 2\left[ \sum_{i=1}^{N} b_i(\tfrac{1}{2}^i) + b_{N+1}(\tfrac{1}{2}^N) \right] Q_{in}$$

where the $b_i$'s are the bits of the digital coefficients. This delay from input to complete output is thus N+1 clock periods, but due to pipelining the throughput rate is equal to the clock rate.

An experimental test unit, when used as a D/A converter, demonstrated 5–6 bits of accuracy in steady-state tests.

Figure 4:
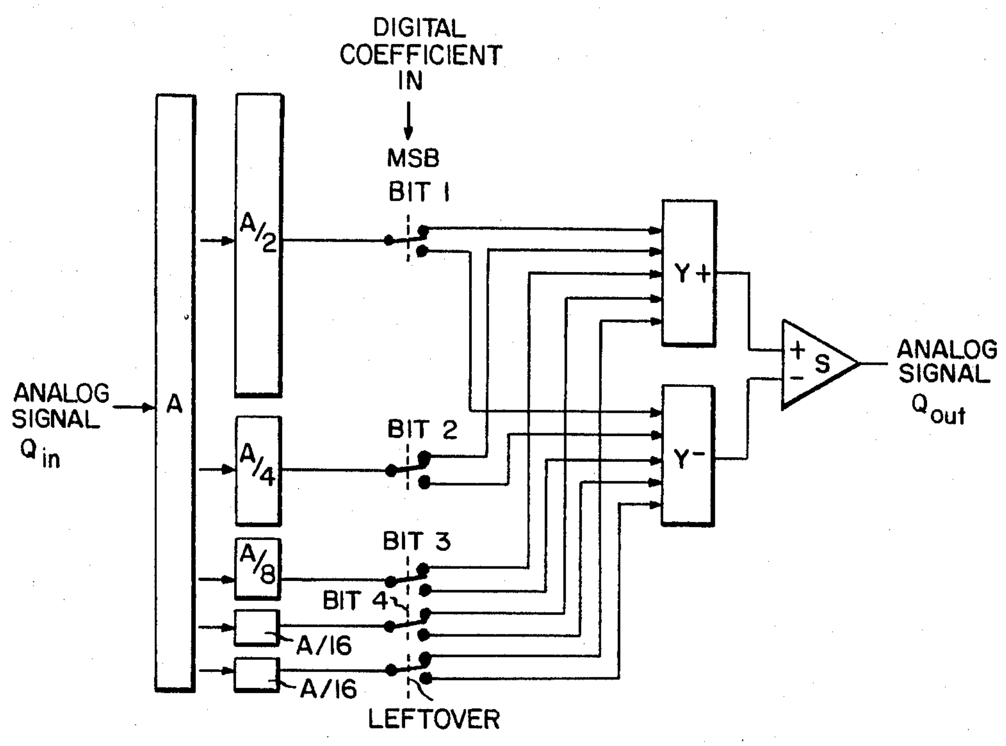
FIG. 4 is a schematic diagram of the parallel programmable charge splitter of the present invention.

A third programmable charge splitter device, which is the invention claimed herein, is a parallel or flash programmable charge splitter device. In this device, shown in FIG. 4, the charge packet formed in well A by analog signal $Q_{in}$ is simultaneously split and channeled into wells equal to $\frac{1}{2}$, $\frac{1}{4}$, $\frac{1}{8}$ . . . $\frac{1}{2}^N$ and another $\frac{1}{2}^N$ times the input well A. Each of these charge portions is channeled to either the Y+ or Y− accumulator well as determined by the appropriate bit of the digital coefficient. A charge combiner S, is coupled to the Y+ and Y− accumulators and provides an output signal $Q_{out}$ whose value corresponds to the difference in magnitude of the charges $Q_{out}$+ and $Q_{out}$− stored therein. The output charge $Q_{out}$ is again as represented by the equation above.

This approach gives a full n-bit multiplication in one clock cycle. However, it requires a wide structure in order to accurately divide the charge. Stated differently, the parallel (flash) charge splitter overcomes the N-period delay of the pipelined charge splitter, but it requires smaller splitting channels, which are harder to control accurately.

A four-bit parallel design of the parallel charge splitter has been evaluated. It demonstrated 6–7 bits of linearity in the MDAC mode. The accuracy appeared to be limited by cross coupling of the address lines into the output. Careful balancing and shielding, as well as on-chip digital shift registers, should alleviate this problem. No transfer inefficiency effects are apparent with this design.

The optimum choice for a practical chip may be a hybrid combination of the pipeline and flash devices. A compact, high speed 9 bit multiplier cell may, for example, include three pipelined stages with three bits of flash (parallel) conversion per stage. This approach appears to be quite practical if careful shielding and proper bias charges are utilized.

These digital/analog multiplier cells can be combined in various forms to yield programmable transversal filters, programmable recursive filters, or a number of other electrically programmable signal processing coefficients. In addition, a single digital/analog multiplier cell can be used as a multiplying D/A converter. This can be seen from the equation for $Q_{out}$. If the analog signal $Q_{in}$ is held constant, then $Q_{out}$ will be an analog representation of the digital coefficient. If the analog signal is allowed to vary, the multiply function is included. Thus, these charge splitter devices cover a broad range of applicability.

Although the invention claimed herein has been described with reference to a particular embodiment, it will be understood to those skilled in the art that the invention is capable of a variety of alternative embodiments within the spirit and scope of the appended claims.

What is claimed is:

1. A parallel programmable charge domain device for multiplying a sampled analog signal represented by a quantity of stored charge by a multiple bit digital word coefficient comprising:

a semiconductor substrate having electrodes insulatively disposed thereon to which signal potentials are applied for inducing wells in said substrate for the storage and propagation of packets of charge therein;

an input signal charge storage well formed in said substrate;

means for introducing a charge packet in said input signal charge storage well having a magnitude corresponding to the value of an applied analog signal;

a plurality of charge splitter wells formed in said substrate;

means for simultaneously distributing substantially the entire charge packet in said input signal charge storage well among said plurality of charge splitter wells;

individual ones of said plurality of charge splitter wells except the last one of said plurality of charge splitter wells receiving a $\frac{1}{2}^N$ fractional portion of the charge packet in said input signal charge storage well, where N is an integer denoting the ordered number of an individual one of said plurality of charge splitter wells;

said last one of said plurality of charge splitter wells receiving the same fractional portion of the charge packet in said input signal charge storage well as the penultimate one of said plurality of charge splitter wells;

a first and a second charge accumulator well formed in said substrate;

first charge transfer gating means associated with individual ones of said plurality of charge splitter wells for selectively enabling the transfer of the charge packets stored therein to said first charge accumulator well;

second charge transfer gating means associated with individual ones of said plurality of charge splitter wells for selectively enabling the transfer of the charge packets stored therein to said second charge accumulator well;

means for applying the ordered bits of a multiple bit digital word to said first charge transfer gating means starting with the application of the most significant bit of said digital word to the lowest ordered individual one of said plurality of charge storage wells, a bit of one value enabling the transfer of the charge packet in the associated individual one of said plurality of charge splitter wells to said first charge accumulator well;

means for applying the complementary ones of said ordered bits of said multiple bit digital word to said second charge transfer gating means starting with the application of the most significant complementary bit of said digital word to the lowest ordered individual one of said plurality of charge storage wells, a complementary bit of said one value enabling the transfer of the charge packet in the associated individual one of said plurality of charge splitter wells to said second charge accumulator well; and charge combiner means coupled to said first and said second charge accumulator wells for providing an output signal whose value corresponds to the difference in the magnitudes of the charge packets stored in said first and said second charge accumulator wells.

2. Apparatus as defined in claim 1 wherein said plurality of charge splitter wells comprises at least five charge splitter wells.

* * * * *